United States Patent
Ogura et al.

(10) Patent No.: US 10,439,389 B2
(45) Date of Patent: Oct. 8, 2019

(54) SEMICONDUCTOR DEVICE, SEMICONDUCTOR SYSTEM, AND ELECTRONIC APPARATUS

(71) Applicant: CANON KABUSHIKI KAISHA, Tokyo (JP)

(72) Inventors: Masanori Ogura, Tokyo (JP); Toru Koizumi, Yokohama (JP); Takanori Watanabe, Yamato (JP); Takanori Suzuki, Tokyo (JP); Jun Iba, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 58 days.

(21) Appl. No.: 15/820,223

(22) Filed: Nov. 21, 2017

(65) Prior Publication Data

US 2018/0152018 A1    May 31, 2018

(30) Foreign Application Priority Data

Nov. 30, 2016  (JP) ................................ 2016-233215

(51) Int. Cl.
*H02H 9/04* (2006.01)
*H01L 27/02* (2006.01)
*H04N 1/00* (2006.01)

(52) U.S. Cl.
CPC ........... *H02H 9/04* (2013.01); *H01L 27/0255* (2013.01); *H01L 27/0266* (2013.01); *H04N 1/00888* (2013.01); *H04N 2201/0081* (2013.01); *H04N 2201/04774* (2013.01)

(58) Field of Classification Search
CPC .............................. H02H 9/04; H01L 27/0255
See application file for complete search history.

(56) References Cited

U.S. PATENT DOCUMENTS

| 5,818,205 A | * | 10/1998 | Borho | ................. | H02M 3/1563 323/282 |
| 2006/0261413 A1 | * | 11/2006 | Yamada | .............. | H01L 27/0255 257/355 |

FOREIGN PATENT DOCUMENTS

JP          2001086641 A       3/2001

* cited by examiner

*Primary Examiner* — Ibrahim Siddo
(74) *Attorney, Agent, or Firm* — Canon U.S.A., Inc. IP Division

(57) ABSTRACT

An aspect of the disclosure relates to a semiconductor device including a semiconductor element, a connection terminal configured to output a signal based on an output of the semiconductor element, a protection circuit connected to the connection terminal, and a voltage limiting element connected to the connection terminal, wherein the protection circuit is connected to a first power supply line having a first potential and a second power supply line having a second potential lower than the first potential, and wherein a potential supplied to the voltage limiting element is higher than the second potential and lower than the first potential.

13 Claims, 12 Drawing Sheets

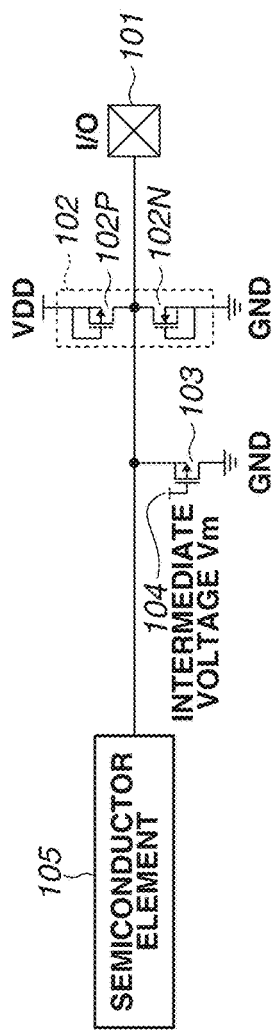
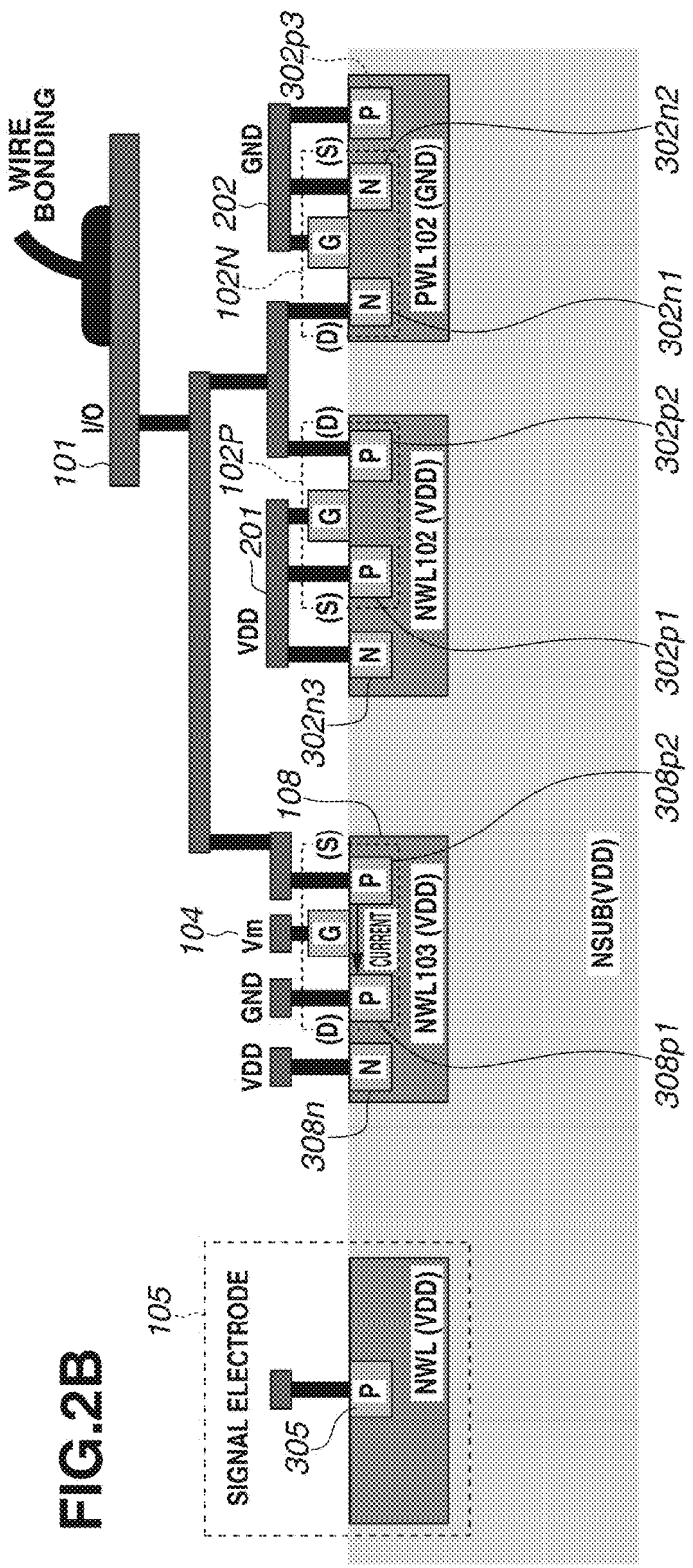

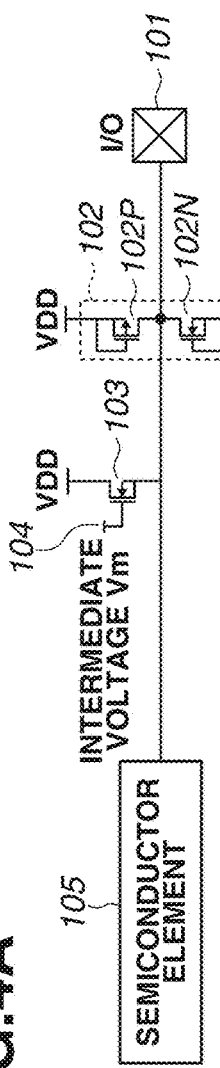
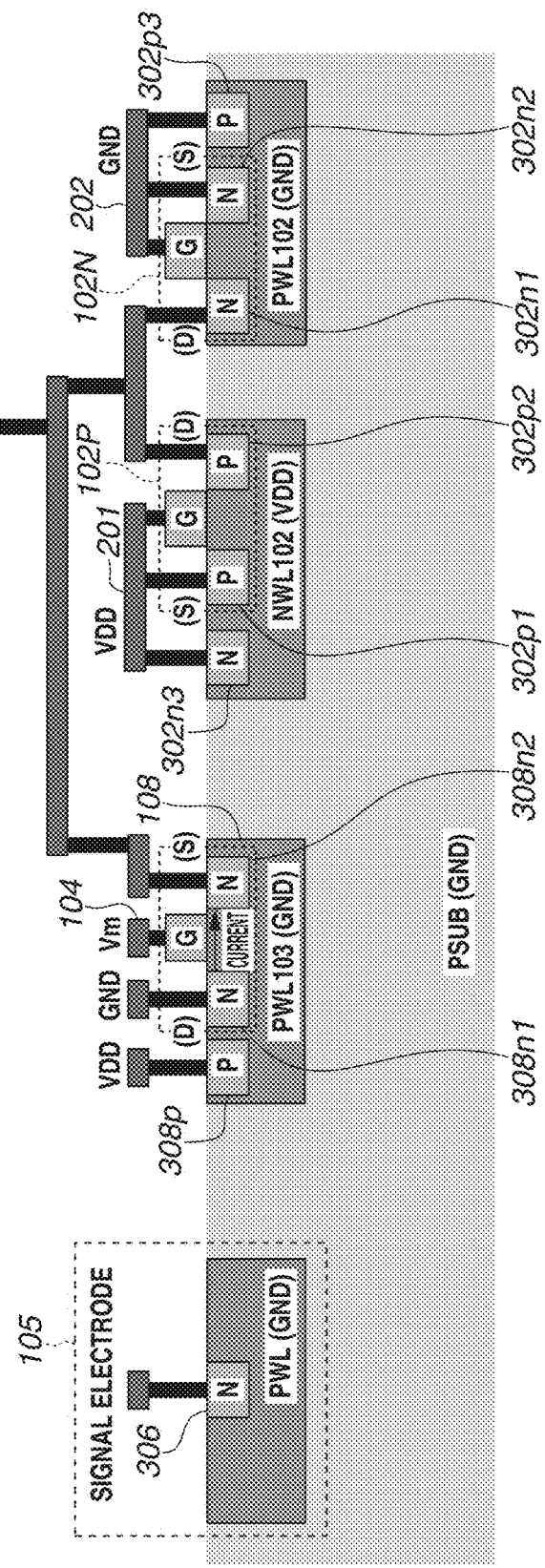
FIG.4A
FIG.4B

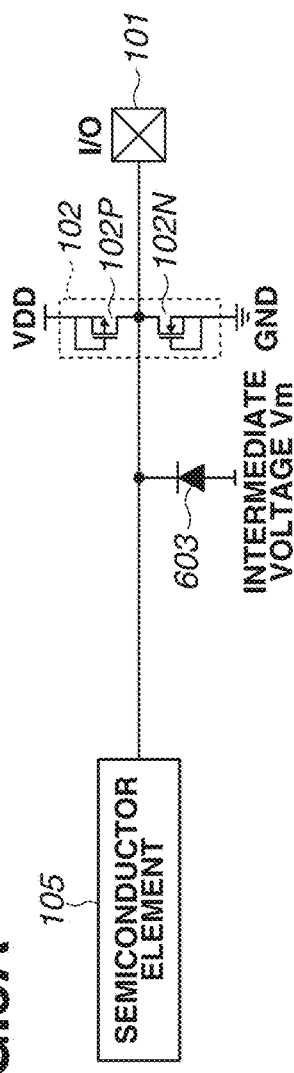
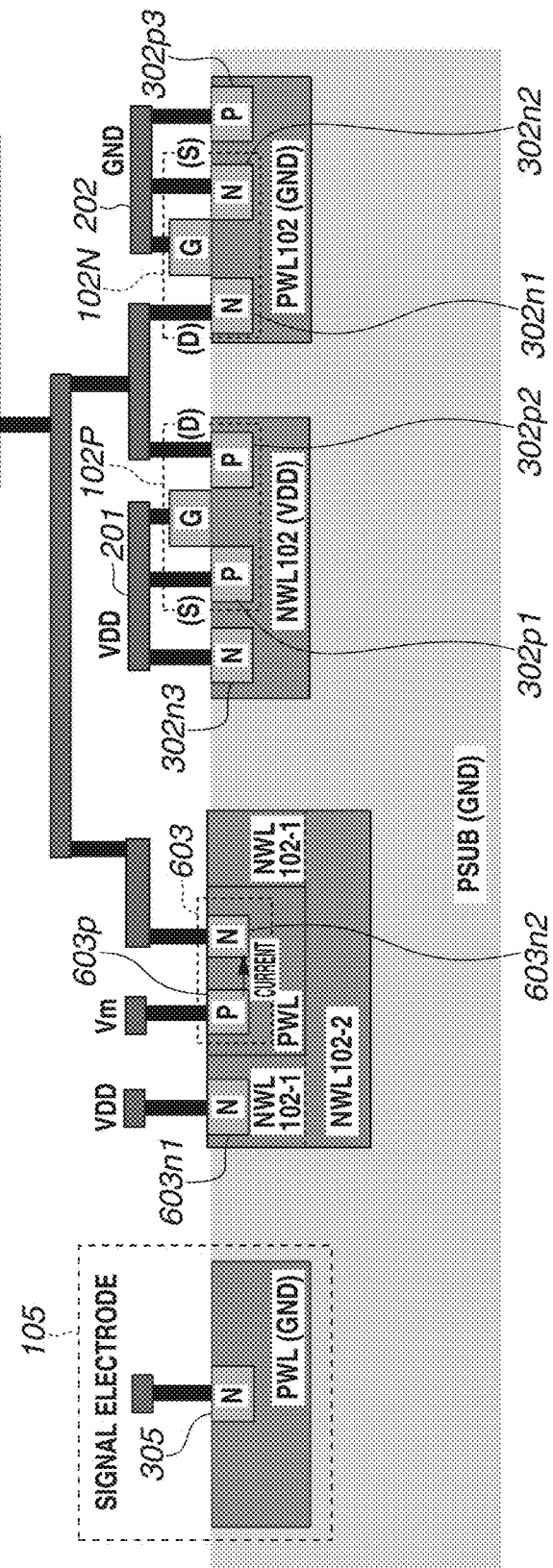
FIG.5A
FIG.5B

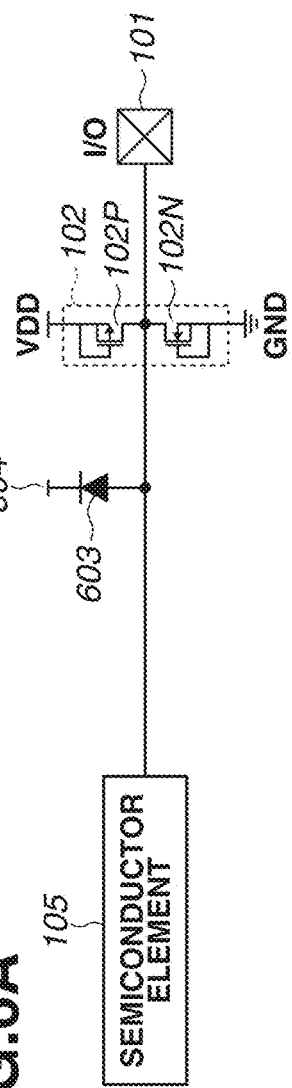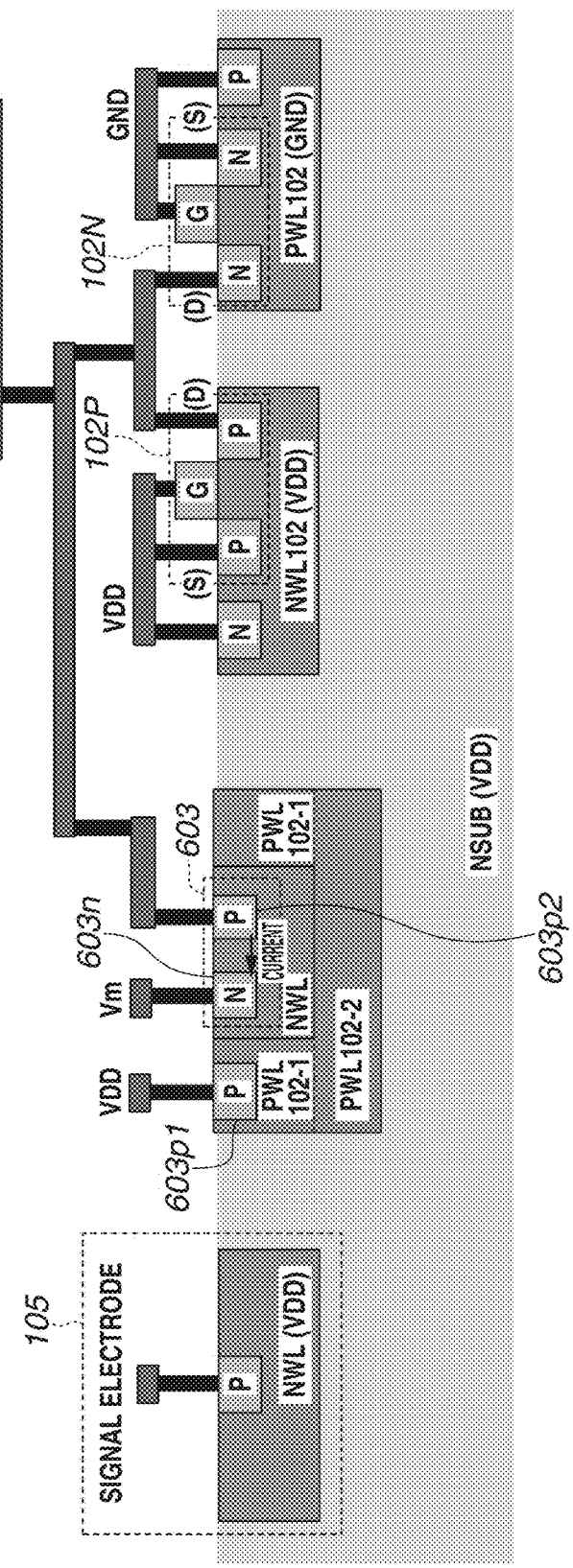

US 10,439,389 B2

SEMICONDUCTOR DEVICE, SEMICONDUCTOR SYSTEM, AND ELECTRONIC APPARATUS

BACKGROUND OF THE INVENTION

Field of the Invention

The disclosure relates to a semiconductor device, a semiconductor system, and an electronic apparatus.

Description of the Related Art

A semiconductor device of a complementary metal-oxide-silicon (complementary MOS (CMOS)) image sensor includes a semiconductor element which includes unit pixels including photoelectric conversion elements and read circuits for reading electrical signals photoelectrically converted by the unit pixels. The semiconductor device further includes a connection terminal for outputting a signal based an output of the semiconductor element to outside the semiconductor device, and a protection circuit arranged between the semiconductor element and the connection terminal.

Japanese Patent Application Laid-Open No. 2001-86641 discusses a semiconductor device which includes a clamp unit in addition to a protection diode. If a signal exceeding a power supply potential is input to a connection terminal from outside, a parasitic bipolar transistor formed in an impurity region constituting a protection circuit turns on. Current can thus flow through the semiconductor substrate. According to Japanese Patent Application Laid-Open No. 2001-86641, the semiconductor device includes the clamp unit to suppress the current.

The clamp unit operates before the protection diode, whereby the voltage of the connection terminal can be clamped substantially to the power supply potential. This reduces the current flowing through the semiconductor substrate due to the turning-on of the parasitic bipolar transistor, and reduces problems occurring in other circuits on the same semiconductor substrate.

SUMMARY OF THE INVENTION

According to an aspect of the disclosure, a semiconductor device includes a semiconductor element, a connection terminal configured to output a signal based an output of the semiconductor element, a protection circuit connected to the connection terminal, and a voltage limiting element connected to the connection terminal, wherein the protection circuit is connected to a first power supply line having a first potential and a second power supply line having a second potential lower than the first potential, and wherein a potential supplied to the voltage limiting element is higher than the second potential and lower than the first potential.

Further features and aspects of the disclosure will become apparent from the following description of numerous example embodiments with reference to the attached drawings.

BRIEF DESCRIPTION OF THE DRAWINGS

FIG. 2A is an equivalent circuit diagram illustrating a configuration of the semiconductor device according to the first example embodiment, and FIG. 2B is a sectional view of part of the semiconductor device.

FIG. 4A is an equivalent circuit diagram illustrating a configuration of the semiconductor device according to the first example embodiment, and FIG. 4B is a sectional view of part of the semiconductor device.

FIG. 5A is an equivalent circuit diagram illustrating a configuration of a semiconductor device according to a second example embodiment, and FIG. 5B is a sectional view of part of the semiconductor device.

FIG. 6A is an equivalent circuit diagram illustrating a configuration of the semiconductor device according to the second example embodiment, and FIG. 6B is a sectional view of part of the semiconductor device.

DESCRIPTION OF THE EMBODIMENTS

According to Japanese Patent Application Laid-Open No. 2001-86641, the voltage input to the clamp circuit is the same as the power supply voltage. Consequently, even if the parasitic bipolar transistor of the protection circuit is not on, the application of a forward bias to the PN junction of the parasitic bipolar transistor of the protection circuit can generate a minute current through the protection circuit. The minute current can affect other elements of the device that includes the protection circuit. Japanese Patent Application Laid-Open No. 2001-86641 does not include a detailed discussion of the problem due to the minute current.

Figure 1:
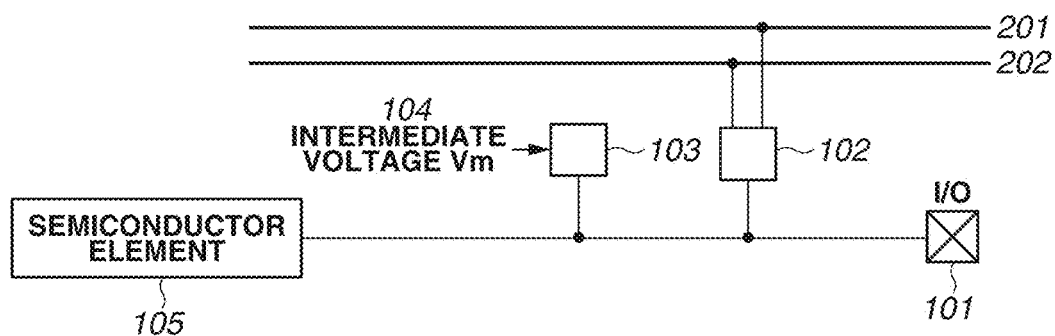
FIG. 1 is an equivalent circuit diagram illustrating a configuration of a semiconductor device according to a first example embodiment.

FIG. 1 illustrates a conceptual diagram of a semiconductor device according to a first example embodiment. The semiconductor device according to the present example embodiment includes a semiconductor element 105, a connection terminal 101, and a protection circuit 102. The semiconductor element 105 is arranged on a semiconductor substrate. The connection terminal 101 is arranged on the semiconductor substrate and outputs a signal based on an output of the semiconductor element 105. The protection circuit 102 is connected to the connection terminal 101. The semiconductor device according to the present example embodiment also includes a voltage limiting element 103 which is connected to the connection terminal 101. As employed herein, a connection terminal refers to a terminal at which the semiconductor device is connected with an external element. Examples include an input terminal and a connection terminal.

The protection circuit 102 is connected to a first power supply line 201 having a first potential V1 and a second power supply line 202 having a second potential V2 lower than the first potential V1. For example, the first potential V1 is a power supply potential. The second potential V2 is a ground potential.

The semiconductor element 105 includes a first impurity region formed in the semiconductor substrate. The voltage limiting element 103 includes a second impurity region formed in the semiconductor substrate. The first and second impurity regions have a PN junction therebetween.

The voltage limiting element 103 is supplied with an intermediate potential Vm from an intermediate power supply 104. The intermediate potential Vm is higher than the second potential V2 which is the lowest potential input to the protection circuit 102, and lower than the first potential V1 which is the highest potential input to the protection circuit 102.

Referring to FIGS. 2A and 2B, a semiconductor device in which the semiconductor element 105 is a photodiode and the voltage limiting element 103 is a clipping circuit 108 will be described as a specific example of the semiconductor device according to the first example embodiment. FIG. 2A illustrates an equivalent circuit of a configuration of the semiconductor device. FIG. 2B is a sectional view of part of the semiconductor device illustrated in FIG. 2A.

For example, the protection circuit 102 is a grounded gate MOS (GGMOS) including a P-type MOS (PMOS) transistor 102P and an N-type MOS (NMOS) transistor 102N. Specifically, the protection circuit 102 includes the PMOS transistor 102P which is connected between the connection terminal and the first power supply line 201, and the NMOS transistor 102N which is connected between the connection terminal and the second power supply line 202. The gate and source of each MOS transistor of the protection circuit 102 are short-circuited.

The first potential of the first power supply line 201 to which the protection circuit 102 is connected is a power supply potential VDD. The second potential of the second power supply line 202 to which the protection circuit 102 is connected is a ground potential GND. The intermediate potential Vm supplied to the voltage limiting element 103 from the intermediate power supply 104 is a potential higher than the ground potential GND and lower than the power supply potential VDD.

The clipping circuit 108 serving as the voltage limiting element 103 includes a PMOS transistor. The intermediate power supply 104 is connected to the gate of the PMOS transistor, whereby voltage is applied to the gate from the intermediate power supply 104.

In FIG. 2B, the semiconductor element 105 is illustrated to be a photodiode. An N-type impurity region NWL functioning as the cathode of the photodiode is arranged in an N-type region NSUB of a semiconductor substrate 100. The N-type impurity region NWL is electrically connected to the N-type region NSUB and has the power supply potential VDD. A P-type impurity region 305 functioning as the anode of the photodiode and the N-type region NSUB have a PN junction therebetween. The P-type impurity region 305 is in an electrically floating state, and functions as a signal holding unit for accumulating a generated charge (hole).

P-type impurity regions 302p1 and 302p2 serving as the source and drain of the PMOS transistor 102P of the protection circuit 102 are formed in an N-type impurity region NWL102. N-type impurity regions 302n1 and 302n2 serving as the source and drain of the NMOS transistor 102N of the protection circuit 102 are formed in a P-type impurity region PWL102.

The N-type impurity region NWL102 is supplied with the power supply potential VDD from the first power supply line 201 via an N-type impurity region 302n3. The P-type impurity region PWL102 is supplied with the ground potential. GND from the second power supply line 202 via a P-type impurity region 302p3.

P-type semiconductor regions 308p1 and 308p2 constitute the source and drain of the PMOS transistor of the clipping circuit 108 functioning as the voltage limiting element 103. The P-type semiconductor regions 308 and 308p2 are formed in an N-type impurity region NWL103. The N-type impurity region NWL103 is supplied with the power supply potential VDD from power supply wiring via an N-type impurity region 308n. The voltage limiting element 103 has a function of limiting the potential of the connection terminal 101 by generating a flow of charge between the connection terminal 101 and the P-type semiconductor region 308p1.

In such a semiconductor device, a potential supplied to the power limiting element 103 is set at the intermediate potential Vm which is lower than the power supply potential VDD, or the first potential, and higher than the ground potential GND, or the second potential. Specifically, the potential supplied to the gate of the NMOS transistor of the clipping circuit 108 is set to be lower than the power supply potential VDD and higher than the ground potential GND. This can reduce the effect of noise on other elements, such as the semiconductor element 105, arranged in the semiconductor substrate from a minute current flowing from the protection circuit 102 to the semiconductor substrate.

The problem of the conventional semiconductor device discussed in Japanese Patent Application Laid-Open No. 2001-86641 and effects of the semiconductor device according to the present exemplary embodiment will be described in detail below.

In FIGS. 1 and 2 of Japanese Patent Application Laid-Open. No. 2001-86641, a clamp circuit is constituted by a PMOS transistor. A power supply potential Vdd is supplied to the gate of the PMOS transistor. When a voltage that exceeds the power supply potential Vdd and does not reach a voltage to turn on a first protection diode is applied to an input terminal, the clamp circuit clamps the connection terminal substantially to the power supply potential Vdd.

After the connection terminal slightly exceeds the power supply potential Vdd and before the GGMOS of a protection circuit comes into operation, a current flows between the source terminal (S) and the drain terminal (D) of the PMOS transistor of the clamp circuit. In other words, a current flows from the input terminal to the power supply potential Vdd side via the PMOS transistor of the clamp circuit. The input terminal is discussed to be thereby clamped substantially to the power supply potential Vdd.

According to Japanese Patent Application Laid-Open No. 2001-86641, the gate potential of the PMOS transistor of the clamp circuit is set at the power supply potential Vdd. In such a case, the potential of the connection terminal is expected to be clipped to approximately Vdd+|Vthpc|. Vthpc is a threshold voltage of the PMOS transistor of the clamp circuit. |Vthpc| is the absolute value of the threshold voltage Vthpc.

To describe the problem to be solved by the semiconductor device of the present exemplary embodiment, a problem of a semiconductor device in which the potential of the connection terminal is limited by supplying the power supply potential Vdd to the voltage limiting element (in Japanese Patent Application. Laid-Open No. 2001-86641, the clamp circuit) as described above will be described.

The protection circuit includes a PMOS transistor and an NMOS transistor. In the protection circuit, P-type impurity regions serving as the source and drain of the PMOS transistor are formed in an N-type impurity region NWL. N-type impurity regions serving as the source and drain of the NMOS transistor are formed in a P-type impurity region PWL.

As described above, if the input terminal exceeds the power supply potential Vdd, the potential of the P-type impurity region that is the drain of the PMOS transistor serving as the diode of the protection circuit becomes Vdd+|Vthpc|. That is, the potential of the P-type impurity region exceeds that of the N-type impurity region NWL to which the power supply potential Vdd is applied. This applies a forward bias voltage to the PN junction of the parasitic diode of the PMOS transistor.

If a forward bias voltage higher than or equal to a forward voltage Vf (for example, 0.7 V) is applied to the PN junction of the diode of the protection circuit, the diode turns ON to pass a large current. If the forward bias voltage applied to the PN junction is higher than 0 V and lower than 0.7 V, a minute current flows through the diode.

Figure 3:
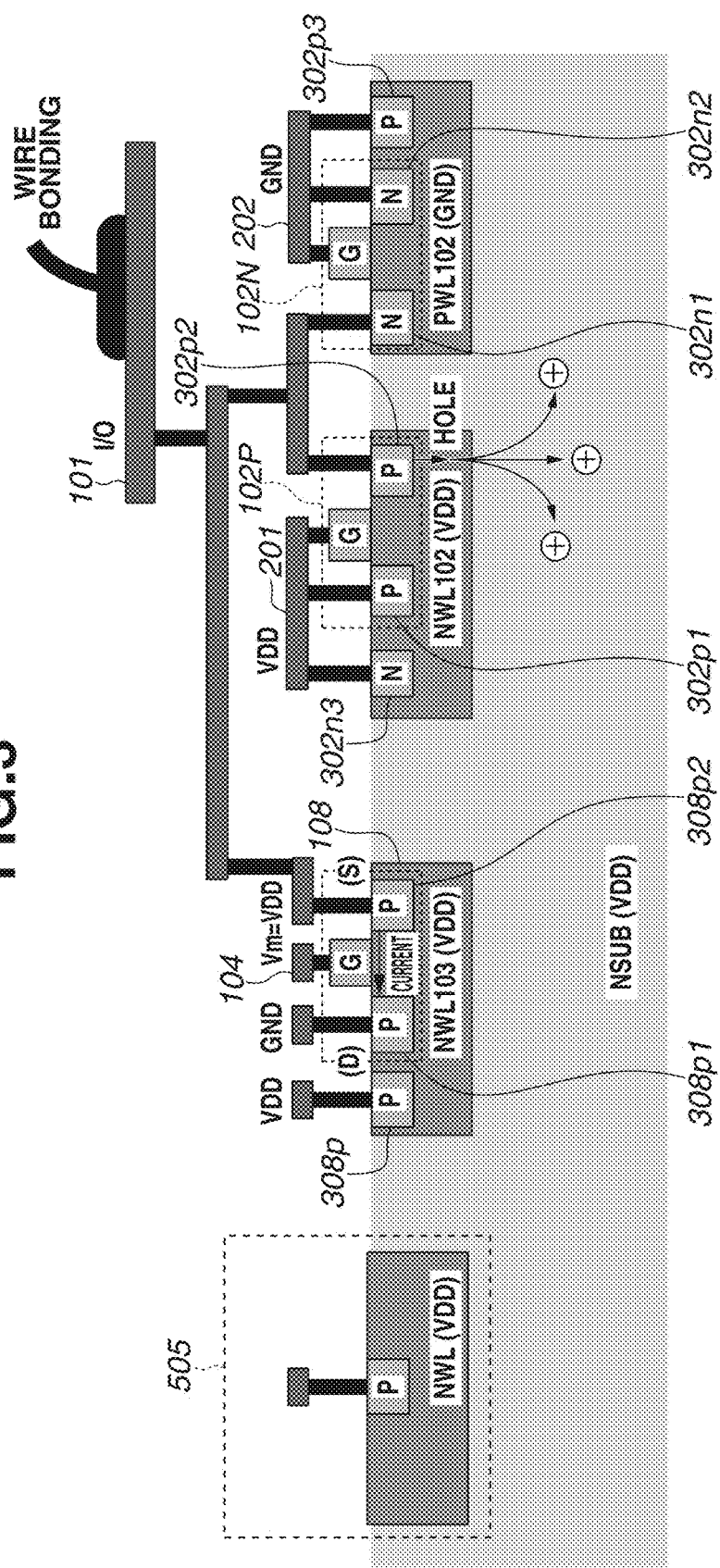
FIG. 3 is a diagram for describing a conventional problem.

The resulting problem will be described with reference to FIG. 3. Suppose that a forward bias voltage higher than or equal to the forward voltage Vf is applied to the PN junction of the diode of the protection circuit. In such a case, a dark current flows from the P-type impurity region 302p2 serving as the drain of the PMOS transistor included in the protection circuit 102 to the N-type impurity region NWL102. A charge (here, hole) is thus injected even into the semiconductor substrate NSUB.

The holes can move as minority carriers through the semiconductor substrate NSUB. Some holes can reach even the semiconductor element 505 arranged on the semiconductor substrate 102 aside from the protection circuit 102. Such holes cause noise and a drop in the measurement accuracy of the semiconductor element 505, whereby the semiconductor element 505 is affected. Suppression of charge given to the semiconductor substrate NSUB via the diode of the protection circuit 102, i.e., reduction of the minute current is therefore desired. Such a problem is not discussed in Japanese Patent Application Laid-Open No. 2001-86641.

In the semiconductor device according to the present example embodiment, the potential supplied to the voltage limiting element 103 is set at a value lower than the power supply potential VDD which is the highest potential input to the protection circuit 102. Specifically, the intermediate potential Vm supplied to the gate of the transistor of the clipping circuit 108 is set at Vm=VDD−α (α is a positive value smaller than VDD).

The potential of the connection terminal 101 is thereby limited to VDD−α+|Vthp|. In other words, the potential of the P-type impurity region 302p2 serving as the drain of the PMOS transistor of the protection circuit 102 can be set at VDD−α+|Vthp|. Vthp is the threshold voltage of the PMOS transistor of the voltage limiting element 103. A potential difference between the P-type impurity region 302p2 and the N-type impurity region NWL102 to which the power supply potential VDD is supplied is thus reduced by α, compared to when the power supply potential VDD is supplied to the gate of the transistor of the clipping circuit 108.

This makes the forward bias voltage on the PN junction between the P-type impurity region 302p2 and the N-type impurity region NWL102 lower than when the power supply potential VDD is supplied to the gate of the transistor of the clipping circuit 108. The charge given to the semiconductor substrate via the diode of the protection circuit 102 can thus be suppressed, or equivalently, the minute current can be reduced.

The minute current from the diode of the protection circuit 102 to the semiconductor substrate can theoretically be eliminated by controlling the potential of the connection terminal not to exceed the power supply potential VDD. Specifically, as illustrated in FIGS. 2A and 2B, the clipping circuit 108 is constituted by a PMOS transistor. The intermediate potential Vm supplied to the gate of the PMOS transistor is set at a potential lower than a potential obtained by subtracting the threshold Vthp the PMOS transistor from the power supply potential VDD (Vm<VDD−|Vthp|).

Here, a current flows between the source terminal (S) and the drain terminal (D) of the PMOS transistor of the clipping circuit 108, from the connection terminal 101 to the ground potential GND, whereby the connection terminal 101 is maintained at a potential lower than the power supply potential VDD. As a result, the potential of the connection terminal 101 does not exceed the power supply potential VDD. This can eliminate the minute current flowing through the semiconductor substrate via the diode of the protection circuit 102 or make it extremely small.

Up to this point, the connection terminal 101 is described to be supplied with a potential exceeding the first potential (for example, VDD) which is the higher power supply potential supplied to the protection circuit 102. However, the disclosure is not limited thereto.

A similar effect can be obtained if the connection terminal 101 is supplied with a potential lower than the second potential (for example, GND) which ds the lower power supply potential supplied to the protection circuit 102. In such a case, a clipping circuit 108 including an NMOS transistor is used as the voltage limiting element 103.

A modification of the semiconductor device illustrated in FIGS. 2A and 2B will be described with reference to FIGS. 4A and 4B. A description of portions having a configuration, function, and effect similar to those of the semiconductor device illustrated in FIGS. 2A and 2B will be omitted. FIG. 4A illustrates an equivalent circuit of the configuration of the semiconductor device. FIG. 4B is a sectional view of part of the semiconductor device illustrated in FIG. 4A.

The intermediate potential Vm supplied to the voltage limiting element 103 from the intermediate power supply 104 is a potential higher than the ground potential GND which is the second potential V2, and lower than the power supply potential VDD which is the first potential V1.

In the clipping circuit 108 serving as the voltage limiting element 103, the intermediate power supply 104 is connected to the gate of the NMOS transistor, and a voltage is applied to the gate of the NMOS transistor from the intermediate power supply 104.

In FIG. 4B, the semiconductor element 105 is illustrated to be a photodiode. A P-type impurity region PWL functioning as the anode of the photodiode is arranged in a P-type region PSUB of the semiconductor substrate 100. The P-type impurity region PWL is electrically connected to the P-type region PSUB and has the ground potential GND. An N-type impurity region 306 serving as the cathode of the photodiode and the P-type region PSUB have a PN junction therebetween. The N-type impurity region 306 is in an electrically floating state, and functions as a signal holding unit for accumulating generated electrons.

N-type semiconductor regions 308n1 and 308n2 constitute the source and drain of the NMOS transistor of the clipping circuit 108 functioning as the voltage limiting element 103. The N-type semiconductor regions 308n1 and 308n2 are formed in a P-type impurity region PWL103. The P-type impurity region PWL103 is supplied with the ground potential GND from power supply wiring via a P-type impurity region 308p.

In such a semiconductor device, a potential supplied to voltage limiting element 103 is set at the intermediate potential Vm which is higher than the second potential V2, the lower of the two power supply potentials supplied to the protection circuit 102. Since the second potential V2 is the ground potential GND, the intermediate potential Vm is a potential higher than the ground potential GND. Specifically, the potential supplied to the gate of the NMOS transistor of the clipping circuit 108 is set to be higher than the ground potential GND.

If a potential lower than the second potential V2 (in FIG. 4B, GND) is supplied to the connection terminal 101, the potential of the drain of the NMOS transistor 102N the protection circuit 102 falls below the potential of the source (GND). This applies a forward bias voltage to a PN junction between the N-type impurity region 302n1 functioning as the drain of the NMOS transistor 102N and the P-type impurity region PWL102.

Even if the forward voltage of the diode constituted by the NMOS transistor 102N is not exceeded, a minute current thus flows through the protection circuit 102. If electrons resulting from the minute current move through the P-type semiconductor substrate PSUB and reach the N-type impurity region 306 via the P-type impurity region PWL, a false signal to the semiconductor element 105 occurs.

On the other hand, if the potential supplied to the gate of the NMOS transistor of the voltage limiting element 103 is set at a potential higher than the second potential V2 (in FIG. 4B, GND), a drop in the potential of the connection terminal 101 can be suppressed. This can reduce the minute current flowing from the protection circuit 102 to the semiconductor substrate PSUB. Specifically, the potential of the connection terminal 101 can be changed from a potential of GND–|Vthn| to a potential of GND+α–|Vthn|. Vthn is the threshold voltage of the NMOS transistor of the voltage limiting element 103. α is a positive value obtained by subtracting the second potential V2 from the potential supplied to the gate of the NMOS transistor of the voltage limiting element 103.

This can reduce the effect of noise on other elements, such as the semiconductor element 105 arranged in the semiconductor substrate, from a minute current flowing from the protection circuit 102 to the semiconductor substrate.

As described above, the potential supplied to the voltage limiting element 103 can be set at the intermediate potential Vm to reduce the minute current flowing through the semiconductor substrate even if a potential beyond the power supply potentials supplied to the protection circuit 102 is supplied to the connection terminal 101 due to a surge. The intermediate potential Vm is a potential lower than the first potential V1 which is the higher of the two power supply potentials supplied to the protection circuit 102, and higher than the second potential V2 which is the lower of the two power supply potentials.

To semiconductor elements to which power supply is constantly applied, the effect of holes due to such a minute dark current is not so significant. The effect is significant, however, to the semiconductor element 105 which includes a region that is in an electrically floating state and has, for example, a signal holding function. Examples of the semiconductor element 105 that includes an impurity region including a signal holding unit are a photoelectric conversion element, a holding capacitor, and a memory element.

As an example of the semiconductor element 105, a photodiode in which a semiconductor substrate NSUB or an N-type impurity region NWL formed in the semiconductor substrate NSUB serves as a cathode and a P-type impurity region formed therein serves as an anode will be described below. The description will be given with reference to FIG. 3.

The photodiode photoelectrically converts light incident on the semiconductor substrate NSUB or the N-type impurity region NWL formed in the semiconductor substrate NSUB and accumulates the generated charge (hole) in the anode, whereby the light is obtained as an electrical signal. The protection circuit 102 includes a diode-connected PMOS transistor and a diode-connected NMOS transistor. The P-type impurity regions 302p1 and 302p2 serving as the source and drain of the PMOS transistor of the protection circuit 102 are formed in the N-type impurity region NWL102.

The N type impurity region NWL of the photodiode and the N-type impurity regions NWL102 in which the source and drain of the PMOS transistor of the protection circuit 102 are formed are both arranged in the semiconductor substrate NSUB.

If a potential higher than the first potential V1 of the protection circuit 102 is supplied to the connection terminal 101 while the semiconductor element 105 is in operation, a minute dark current may flow through the PN junction of the protection circuit 102 as described above. In FIG. 3, the N-type impurity region NWL102 in which the source and drain of the PMOS transistor of the protection circuit 102 are formed, the semiconductor substrate NSUB, and the cathode NWL of the photodiode have the same conductivity type (N-type).

The minute current can sometimes deliver holes from the N-type impurity region NWL102 to the anode of the photodiode via the semiconductor substrate NSUB. The holes reaching the anode of the photodiode produce a false signal since the holes are not generated by photoelectric conversion.

In particular, the wider the range in which a photodiode can capture carriers, the higher the sensitivity and performance the photodiode is considered. The photodiode is therefore likely to capture not only holes derived from a light signal but also ones diffusing to near the N-type impurity region NWL through the foregoing route. The minute current flowing through the protection circuit 102 can thus affect the photodiode that is the semiconductor element 105, and lower the measurement accuracy of the photodiode.

In the semiconductor device according to the present example embodiment, the gate voltage of the transistor of the clipping circuit 108 serving as the voltage limiting element 103 is set at the intermediate potential Vm. Specifically, the intermediate potential Vm is set to be higher than the second potential V2 (for example, GND) which is the lower of the two power supply potentials of the protection circuit 102, and lower than the first potential V1 (for example, VDD) which is the higher. This can reduce the minute current flowing from the protection circuit 102 to the semiconductor substrate.

The gate of the PMOS transistor of the voltage limiting element 103 is supplied with an intermediate potential Vmp. The intermediate potential Vmp is set at a potential lower than a potential obtained by subtracting the threshold Vthp of the PMOS transistor from the higher, first potential V1 (for example, VDD) of the protection circuit 102 (Vmp<VDD–|Vthp|). Alternatively, the gate of the NMOS transistor of the voltage limiting element 103 is supplied with an intermediate potential Vmn. The intermediate potential Vmn is set at a potential higher than a potential obtained by adding the absolute value of the threshold of the NMOS transistor, |Vthn|, to the second potential V2 (for example, GND) (Vmn>GND+|Vthn|).

In such a manner, the potential of the input terminal can be brought into the range higher than the second potential V2 (for example, GND) which is the lower of the two power supply potentials of the protection circuit 102, and lower than the first potential V1 (for example, VDD) which is the higher. As a result, the source and drain of the PMOS transistor or NMOS transistor of the protection circuit 102 and the well in which the source and drain are formed are reversely biased all the time, and holes derived from a minute dark current can be substantially eliminated. As a result, false-signal holes captured by the photodiode can be greatly reduced.

As illustrated in FIG. 2B, if the N-type semiconductor substrate NSUB is used, the reduction or no generation of holes which are minority carriers that can move through the semiconductor substrate NSUB is effective. The clipping circuit 108 is therefore configured so that the potential of the connection terminal 101 exceeds the first potential V1 by a smaller amount or does not exceed the first potential V1.

As illustrated in FIG. 4B, if the P-type semiconductor substrate PSUB is used, no generation electrons which are minority carriers that can move through the semiconductor substrate PSUB is effective. The clipping circuit 108 may therefore be configured so that the potential of the connection terminal 101 falls below the second potential V2 by a smaller amount or does not fall below the second potential V2.

To isolate toe protection circuit 102 from the semiconductor element 105, for example, if the semiconductor substrate is the N-type semiconductor substrate NSUB, a process for injecting P-type impurity ions may be provided. Specifically, there may be provided a process for injecting P-type impurity ions into the semiconductor substrate NSUB between the drain region of the PMOS transistor of the protection circuit 102 and the semiconductor element 105. However, the configuration of the present example embodiment does not need the addition of a new ion injection process. The minute current from the protection circuit 102 can be reduced or eliminated without increasing the semiconductor manufacturing processes or increasing cost.

According to the aforementioned example embodiment, a semiconductor device with fewer false signals can be provided at low cost.

A second example embodiment will be described with reference to FIGS. 5A, 5B, 6A, and 6B. In the present example embodiment, a description of portions having a configuration, function, and effect similar to those of the first example embodiment will be omitted. The present example embodiment differs from the first example embodiment in that the clipping circuit serving as the voltage limiting element 103 is constituted by a diode 603.

FIG. 5A illustrates an equivalent circuit of the semiconductor device according to the present example embodiment. FIG. 5B illustrates a sectional view of part of the semiconductor device. As illustrated in FIG. 5B, the diode 603 includes a P-type impurity region PWL serving as an anode and an N-type impurity region 603n2 serving as a cathode. The N-type impurity region 603n2 is connected to the connection terminal 101. The intermediate potential Vm is supplied to the P-type impurity region PWL via a p-type impurity region 603p. The P-type impurity region PWL is surrounded by N-type semiconductor regions NWL102-1 and NWL102-2, and electrically isolated from the semiconductor substrate PSUB.

In FIGS. 5A and 5B, the conductivity type of the semiconductor substrate PSUB is P-type, and minority carriers are electrons. In such a case, to suppress effects on the semiconductor element 105 arranged on the semiconductor substrate PSUB, inflow of electrons from the protection circuit 102 into the semiconductor substrate PSUB can be suppressed.

The intermediate potential Vm is then set to be higher than a potential obtained by adding the absolute value of a forward voltage Vf1 of the diode 603 to the second potential V2 which is the lower of the two power supply potentials supplied to the protection circuit 102. That is, the intermediate potential Vm is set so that Vm>V2+|Vf1|. For example, if the second potential V2 is GND (0 V) and the forward voltage Vf1 of the diode 603 is 0.7 V, the intermediate potential Vm is set to be higher 0.7 V (Vm>0.7 V).

If the potential of the connection terminal 101 falls below the second potential V2, a current flows through the diode 603 and the potential of the connection terminal 101 becomes higher than or equal to the second potential V2. This can reduce or eliminate the minute current flowing from the protection circuit 102 to the semiconductor substrate PSUB, and can reduce or eliminate the effects on the semiconductor element 105 arranged on the semiconductor substrate PSUB.

FIGS. 6A and 6B illustrate a modification of the semiconductor device illustrated in FIGS. 5A and 5B. FIG. 6A illustrates an equivalent circuit of the semiconductor device. FIG. 6B illustrates a sectional view f part of the semiconductor device.

As illustrated in FIG. 6B, the diode 603 includes a P-type impurity region 603p2 serving as an anode and an N-type impurity region NWL serving as a cathode. The intermediate potential Vm is supplied to the N-type impurity region NWL via an N-type impurity region 603n. The P-type impurity region 603p2 is connected to the connection terminal 101. The N-type impurity region NWL is surrounded by P-type semiconductor regions PWL102-1 and PWL102-2, and electrically isolated from t e semiconductor substrate NSUB.

In FIGS. 6A and 6B, the conductivity type of the semiconductor substrate NSUB is N-type, and minority carriers are holes. In such a case, to suppress effects on the semiconductor element 105 arranged on the semiconductor substrate NSUB, inflow of holes from the protection circuit 102 to the semiconductor substrate NSUB can be suppressed. In other words, the potential of the connection terminal 101 can be prevented from exceeding the first potential V1 (for example, VDD).

The intermediate potential Vm is then set to be lower than a potential obtained by subtracting the absolute value of the forward voltage Vf1 of the diode 603 from the first potential V1 which is the higher of the two power supply potentials supplied to the protection circuit 102. That is, the intermediate potential Vm is set so that Vm<V1−|Vf1|. For example, if the first potential V1 is the power supply potential VDD and the forward voltage Vf1 of the diode 603 is 0.7 V, the intermediate potential Vm is set to a potential lower than the value obtained by subtracting 0.7 V from VDD (Vm<VDD−0.7 V).

If the potential of the connection terminal 101 exceeds the first potential V1, a current flows through the diode 603 and the potential of the connection terminal 101 becomes lower than or equal to the first potential V1. This can reduce or eliminate the minute current flowing from the protection circuit 102 to the semiconductor substrate NSUB, and can reduce or eliminate the effects on the semiconductor element 105 arranged on the semiconductor substrate NSUB.

Even in the present example embodiment, electrons or holes injected into the substrate can thus be reduced. As a result, false signals detected by the photodiode can be greatly reduced.

A semiconductor device according to a third example embodiment will be described with reference to FIGS. 7 and 8. In the third example embodiment, an element that generates an intermediate potential Vm to be input to the gate of a MOS transistor when the clipping circuit is constituted by the MOS transistor as in the first example embodiment will be described.

Figure 7:
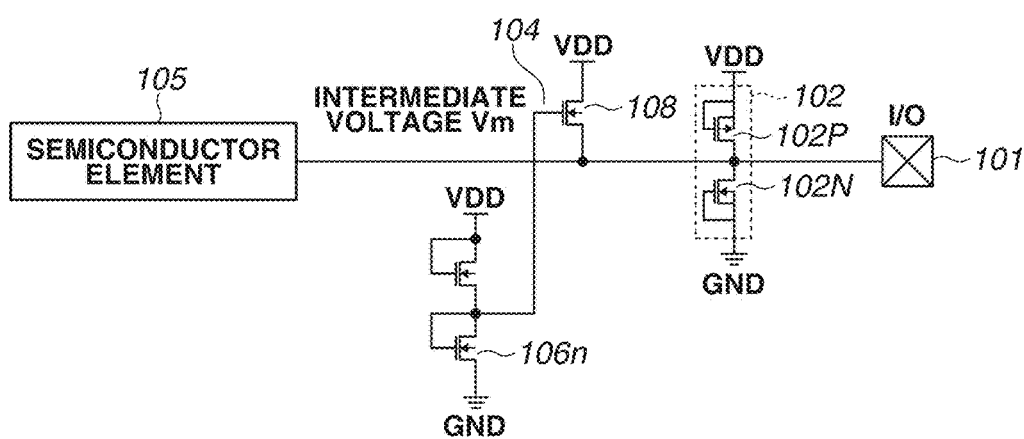
FIG. 7 is an equivalent circuit diagram illustrating a configuration of a semiconductor device according to a third example embodiment.
Figure 8:
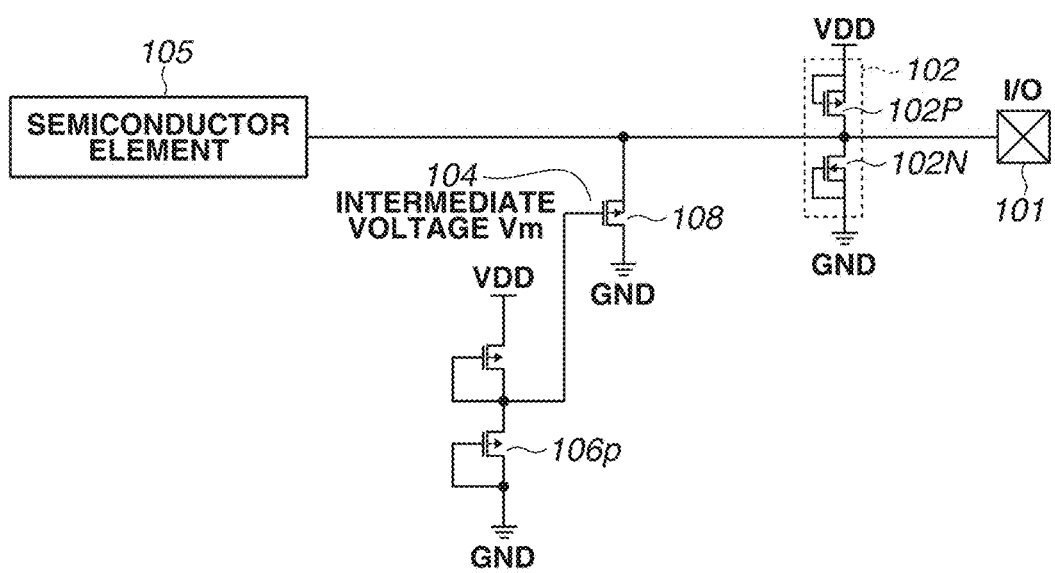
FIG. 8 is an equivalent circuit diagram illustrating a configuration of the semiconductor device according to the third example embodiment.

As illustrated in FIG. 7, if the clipping circuit 108 is an NMOS transistor, the intermediate potential Vm can be generated by an intermediate potential generation unit. 106n including two diode-connected NMOS transistors. In other words, the clipping circuit 108 and the intermediate potential generation unit 106n are constituted by NMOS transistors. The threshold of the NMOS transistors of the intermediate potential generation unit 106n thus follows variations in the threshold of the NMOS transistor of the clipping circuit 108.

For such a reason, the voltage of the connection terminal 101 can be stably adjusted without being much affected by variations in the threshold of the NMOS transistors. The potential of the connection terminal 101 can also be stably adjusted with respect to variations in the ground potential GND.

A case in which the clipping circuit 108 is constituted by a PMOS transistor will be described with reference to FIG. 8. The intermediate potential Vm can be generated by an intermediate potential generation unit 106p including two diode-connected PMOS transistors. In other words, the clipping circuit 108 and the intermediate potential generation unit 106p can be constituted by PMOS transistors. The threshold of the PMOS transistors of the intermediate potential generation unit 106p thus follows variations in the threshold of the PMOS transistor of the clipping circuit 108.

The voltage of the connection terminal 101 can thus be stably adjusted without being much affected by variations in the threshold of the PMOS transistors. The potential of the input terminal 101 can also be stably adjusted with respect to variations in the power supply potential VDD.

In such a manner, false signals detected by the semiconductor element 105, such as a photodiode, arranged on the semiconductor substrate an which the protection circuit 102 is arranged can be greatly reduced.

A semiconductor device according to a fourth example embodiment will be described with reference to FIGS. 9 and 10. In the fourth example embodiment, a switch 107 is arranged between the semiconductor element 105 and the voltage limiting element 103 of the semiconductor device illustrated in FIG. 4. In the present example embodiment, a plurality of semiconductor devices (here, semiconductor chips) each equipped with a switch may be arranged and connected on the substrate.

Figure 9:
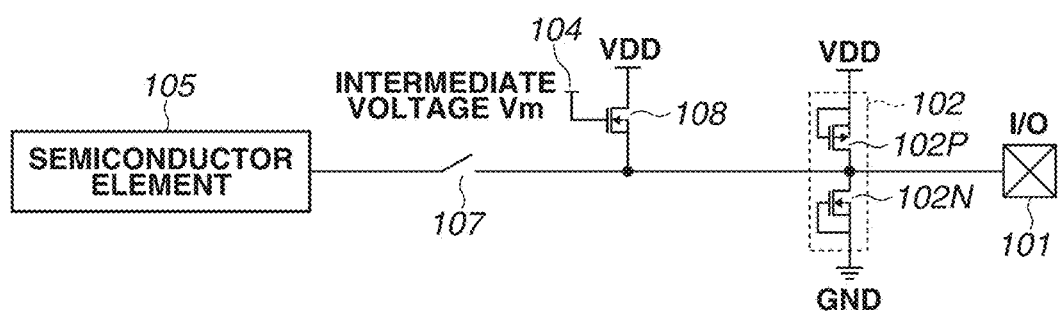
FIG. 9 is an equivalent circuit diagram illustrating a configuration of a semiconductor device according to a fourth example embodiment.

FIG. 9 illustrates the semiconductor device in which the switch 107 is arranged between the semiconductor element 105 and the connection terminal 101. The semiconductor element 105, the switch 107, the voltage limiting element 103, the protection circuit 102, and the connection terminal 101 of the semiconductor device illustrated in FIG. 9 are arranged on the same semiconductor substrate. Such a semiconductor device will be referred to as a semiconductor chip.

Figure 10:
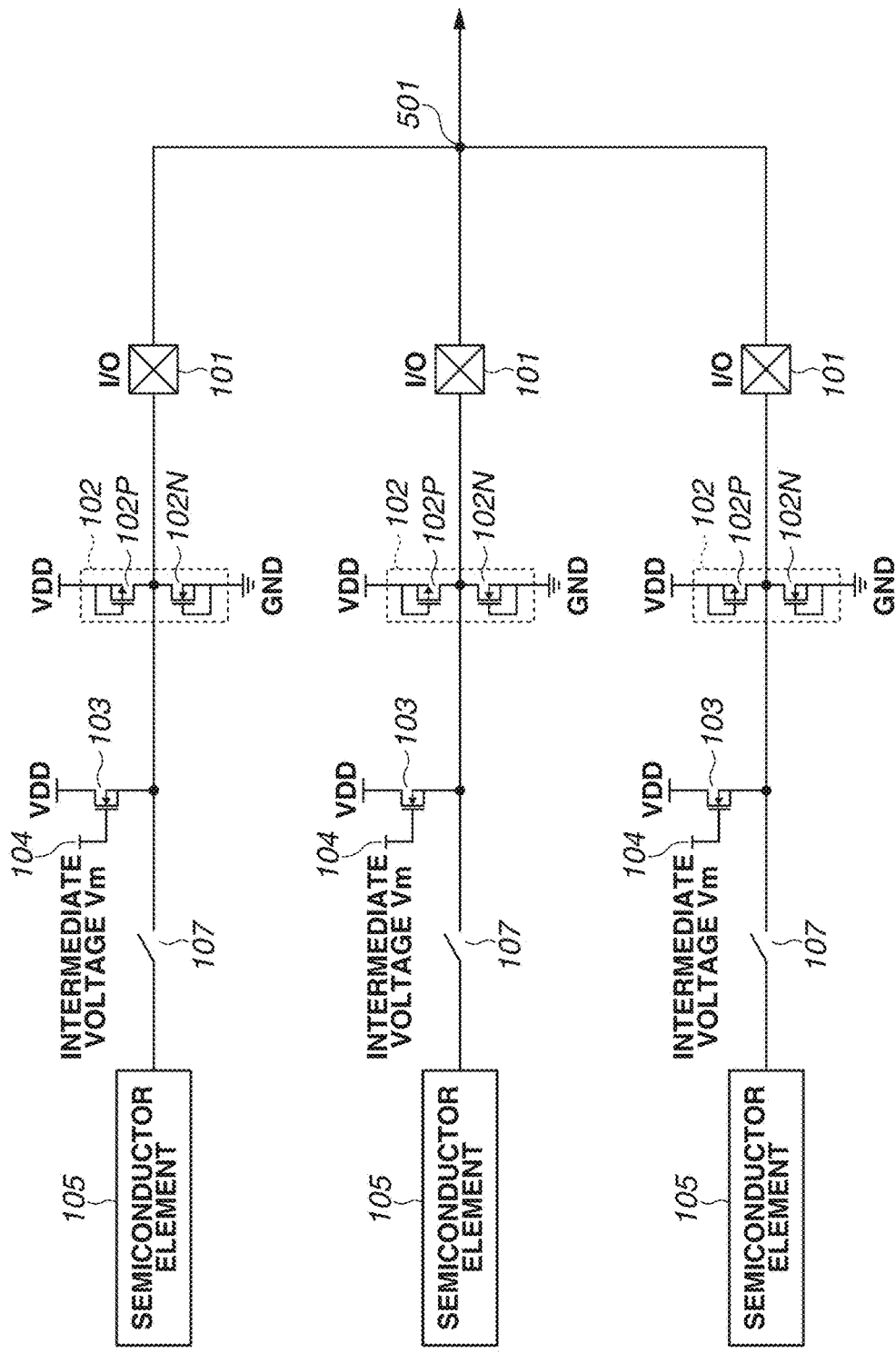
FIG. 10 is an equivalent circuit diagram illustrating a configuration of an electronic apparatus according to the fourth example embodiment.

FIG. 10 illustrates an example of a semiconductor system in which a plurality of semiconductor chips illustrated in FIG. 9 is arranged on a substrate, and the connection terminals 101 of the respective semiconductor chips are connected to a common pad 501 which is arranged outside the semiconductor chips. The plurality of connection terminals 101 is connected in parallel and connected to a not-illustrated external analog front end (AFE).

In the semiconductor system of FIG. 10, the output of one of the semiconductor elements 105 can be selectively output to outside the semiconductor chip by turning an the switch 107 of the one semiconductor chip only and turning off the switches 107 of the other semiconductor chips. Instead of providing external elements such as AFEs for the respective semiconductor chips, one or several external elements such as AFEs then may be provided for the plurality of semiconductor chips, and the signals from the respective semiconductor chips can be output to the AFE(s) in a multiplex manner. This can reduce the number of external elements such as AFEs, reduce the size of the semiconductor system, and reduce cost.

If the switches 107 of all the semiconductor devices are off, the potentials of the connection terminals 101 become more changeable with the input of a surge. If the potentials of the connection terminals 101 change due to a surge, minute currents flow from the protection circuits 102 to the substrate and cause noise and a drop in the measurement accuracy of the semiconductor elements 105. The semiconductor chips then can include the configuration of the voltage limiting element 103 of any one of the semiconductor devices according to the first to third example embodiment, whereby minute currents from the protection circuits 102 to the semiconductor substrate are reduced or prevented.

Figure 11:
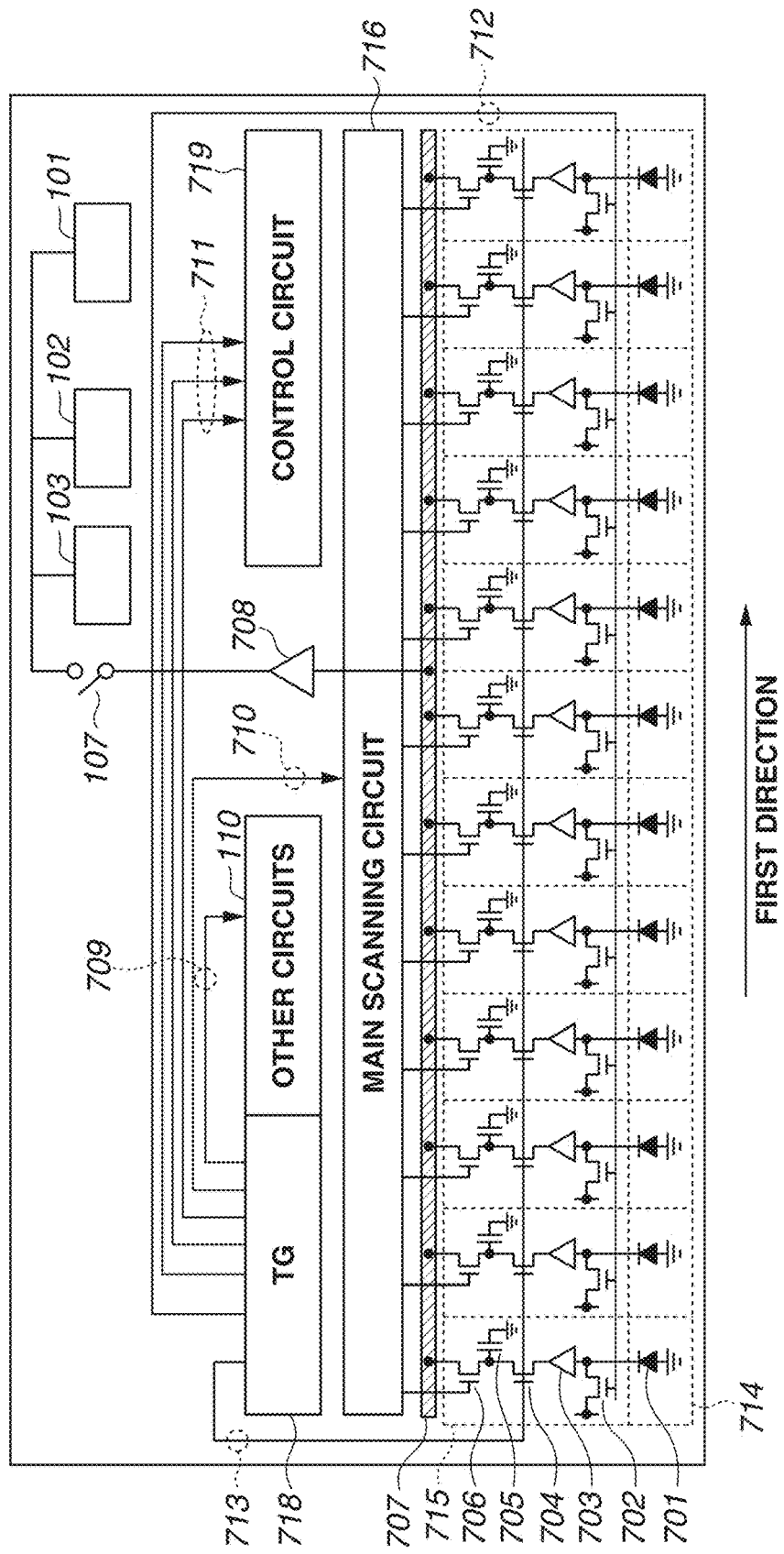
FIG. 11 is an equivalent circuit diagram illustrating a configuration of a semiconductor device according to the fourth example embodiment.

For example, the semiconductor system according to the present example embodiment may be configured as a line sensor including a plurality of semiconductor chips including photoelectric conversion elements (photodiodes) as the semiconductor element 105. FIG. 11 illustrates a circuit diagram of one of the semiconductor chips of the line sensor.

The semiconductor device illustrated in FIG. 11 includes a plurality of photoelectric conversion elements 701 arranged in a first direction. The semiconductor device further includes read circuits 715 corresponding to the photoelectric conversion elements 701, a common output line 707, and an output amplifier 708.

In FIG. 11, pixels 714 are photoelectric conversion element units. The photoelectric conversion elements 701 are photodiodes. In the present example embodiments, a plurality of pixels is arranged in a row. The read circuits 715 read light signals according to the amounts of light incident on the photoelectric conversion elements 701, from the pixels 714. The read circuits 715 are circuits for reading the light signals. The read circuits 715 are arranged to correspond to the respective corresponding pixels 714. The read circuits 715 may each include a reset transistor 702, an amplifier 703, a first switch 704, a line memory 705, and a second switch 706. The reset transistor 702 resets the photoelectric conversion element 701. The amplifier 703 amplifies and outputs the light signal. The first switch 704 is a transistor for transmitting the output of the amplifier 703 to the line memory 705. The line memory 705 is a capacitor for holding the signal from the pixel 714. The second switch 706 is a transistor for transmitting the light signal held in the line memory 705 to a subsequent-stage circuit.

The common output line 707 is arranged at the subsequent stage of the read circuits 715. The plurality of line memories 705 is electrically connected to the common output line 707 via the corresponding second switches 706. A main scanning circuit 716 controls on/off of the plurality of second switches 706. Under the control of the main scanning circuit 716, the light signals from the plurality of pixels 714 can be sequentially read to the common output line 707. The output amplifier 708 is arranged at the subsequent stage of the common output line 707. The output amplifier 708 amplifies and outputs the light signal read to the common output line 707. In the present example embodiment, the common output line 707 and the output amplifier 708 constitute an output circuit. A timing generator (TG) 718 outputs clock signals for defining operation timing of circuit blocks. A control circuit 719 is a circuit that performs control needed to drive the line sensor.

In the present example embodiment, the pixels 714, the read circuits 715, and the output circuit are analog circuits. The main scanning circuit 716, the TG 718, the control circuit 719, and other circuits 110 are digital circuits. Such circuit blocks are circuits needed to process the light signals. In other words, such circuits are all included in a signal processing circuit. The signal processing circuit may include an analog-to-digital conversion circuit (hereinafter, ADC) for converting an analog signal into a digital signal.

In FIG. 11, a signal line 709 electrically connects the TG 718 with the other circuits 110. A signal line 710 electrically connects the TG 718 with the main scanning circuit 716. Signal lines 711 electrically connect the TG 718 with the control circuit 719. A signal line 712 electrically connects the TG 718 with the gates of the reset switches 702. A signal line 713 electrically connects the TG 718 with the gates of the first switches 704. In fact, more signal lines may be provided. The signal lines 709 to 713 transmit clock signals output from the TG 718, for example.

The read circuits 715 include the amplifiers 703. The output circuit includes the output amplifier 708. The output of the output amplifier 708 is the output of the semiconductor element 105 in FIGS. 1 to 10. The switch 107, the voltage limiting element 103, the protection circuit 102, and a pad electrode serving as the connection terminal 101 are successively connected to the output of the semiconductor element 105 by wiring.

The line sensor including an array of a plurality of such semiconductor devices produces outputs of the semiconductor chips at respective different timings by using the switches 107. In such a configuration, an accumulation period for accumulating charges in the photodiodes of the semiconductor devices may be provided after the output of all the semiconductor chips ends. In such a case, all the switches 107 are turned off during the accumulation period. This brings the connection terminals 101 of the semiconductor chips into a floating state. If a surge is input, the potentials of the connection terminals 101 are greatly affected by the surge.

The effect of the inclusion of any of the semiconductor devices according to the first to third example embodiments is particularly significant to such a line sensor. More specifically, if each semiconductor chip (semiconductor device) includes any one of the voltage limiting elements 103 according to the first to third example embodiments, a minute current from the protection circuit 102 to the semiconductor substrate due to a surge can be effectively reduced. This can greatly reduce false signals detected by the photodiodes and improve the measurement accuracy of the photodiodes.

In the foregoing description, the protection circuit 102 is described to be constituted by a GGMOS. However, the disclosure is not limited thereto. If the protection circuit 102 is a diode, holes or electrons to cause a minute dark current in the PN junction of the diode occur if a potential higher than or equal to the power supply potential V1 or lower than or equal to the power supply potential V2 of the protection circuit 102 is input to the connection terminal 101. If the protection circuit 102 is constituted by a diode, any one of the semiconductor devices according to the foregoing first to third example embodiments can be employed to provide the foregoing effect.

Figure 12:
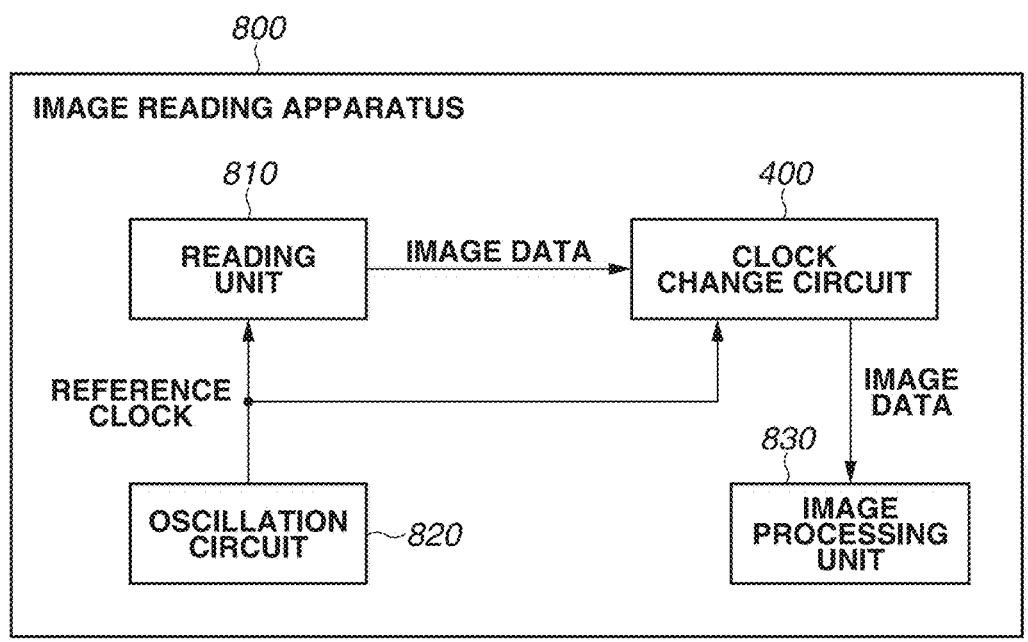
FIG. 12 is a block diagram illustrating a configuration of an electronic apparatus according to a fifth example embodiment.

A configuration example of an image reading apparatus 800 which is an example of an electronic apparatus according to a fifth example embodiment will be described with reference to the block diagram of FIG. 12. Examples of the image reading apparatus 800 may include a multifunction peripheral (MFP), a scanner, and a copying machine. The image reading apparatus 800 includes a clock change circuit 400, a reading unit 810, an oscillation circuit 820, and an image processing unit 830.

The reading unit 810 reads a document and generates image data. The reading unit 810 may include a light source, a reduction optical component, a line sensor, an analog-to-digital converter, and a controller. The line sensor described in the fourth example embodiment may be used as the line sensor. The oscillation circuit 820 generates and supplies a reference clock to the reading unit 810 and the clock change circuit 400. The reading unit 810 operates according to the supplied reference clock. For example, the reference clock may have a frequency of several hundreds of megahertz.

The clock change circuit 400 receives the image data from the reading unit 810 according to the reference clock as described above, and supplies the image data to the image processing unit 830 according to a spread spectrum clock. The image processing unit 830 performs processing of the supplied image data. The image processing unit 830 thus processes data based on the image data output from the reading unit 810.

The reading unit 810, the oscillation circuit 820, and the clock change circuit 400 may be mounted on a movable part of the image reading apparatus 800. The image processing unit 830 may be mounted on a main body part of the image reading apparatus 800. The clock change circuit 400 and the image processing unit 830 can be connected by a wire harness of several tens of centimeters, for example.

While the disclosure has been described with reference to example embodiments, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2016-233215, filed Nov. 30, 2016, which is hereby incorporated by reference herein in its entirety.

What is claimed is:

1. A semiconductor device comprising:
a semiconductor element;
a connection terminal configured to output a signal based on an output of the semiconductor element;
a protection circuit connected to the connection terminal; and
a voltage limiting element connected to the connection terminal,
wherein the protection circuit is connected to a first power supply line having a first potential and a second power supply line having a second potential lower than the first potential, wherein a potential supplied to the voltage limiting element is higher than the second potential and lower than the first potential, wherein the semiconductor element includes a first impurity region formed in a semiconductor substrate, wherein the voltage limiting element includes a second impurity region formed in the semiconductor substrate, wherein the semiconductor substrate is provided with the protection circuit, and wherein a PN junction exists between the first impurity region and the second impurity region.

2. The semiconductor device according to claim 1, wherein the first impurity region of the semiconductor element includes a signal holding unit.

3. The semiconductor device according to claim 1, wherein the voltage limiting element is configured to limit a potential of the connection terminal by generating a flow of charge between the connection terminal and the second impurity region.

4. The semiconductor device according to claim 1,
wherein the voltage limiting element is a metal-oxide-silicon (MOS) transistor, and
wherein the potential supplied to the voltage limiting element is supplied to a gate of the MOS transistor, the second impurity region is a drain of the MOS transistor, and a source of the MOS transistor is connected to the connection terminal.

5. The semiconductor device according to claim 1,
wherein the voltage limiting element is a diode,
wherein an anode or a cathode of the diode is connected to the connection terminal, and
wherein the other of the anode and cathode of the diode is the second impurity region, and the potential supplied to the voltage limiting element is supplied to the second impurity region.

6. The semiconductor device according to claim 1, wherein the semiconductor element includes a photoelectric conversion element.

7. The semiconductor device according to claim 6, wherein the semiconductor element includes the photoelectric conversion element and a read circuit configured to read a signal from the photoelectric conversion element.

8. The semiconductor device according to claim 1, wherein the semiconductor element includes a plurality of photoelectric conversion elements arranged in a first direction.

9. The semiconductor device according to claim 1, wherein the semiconductor element is a memory element.

10. The semiconductor device according to claim 1, further comprising a switch between the semiconductor element and the voltage limiting element.

11. A semiconductor system comprising:
a plurality of semiconductor devices according to claim 10; and
a pad to which outputs from the connection terminals of the plurality of semiconductor devices are input.

12. The semiconductor system according to claim 11, wherein the switches of the plurality of semiconductor devices turn on at different timing.

13. An electronic apparatus comprising:
a reading unit configured to read a document and generate image data, the reading unit including the semiconductor system according to claim 11; and
a processing unit configured to process data based on the image data.

* * * * *